US008320789B2

(12) United States Patent
Takatsu et al.

(10) Patent No.: US 8,320,789 B2
(45) Date of Patent: Nov. 27, 2012

(54) COOLING APPARATUS AND IMAGE FORMATION APPARATUS

(75) Inventors: Hiroaki Takatsu, Nishio (JP); Satoru Sasaki, Toyokawa (JP); Akinori Kimata, Toyokawa (JP); Natsuyo Higashi, Toyokawa (JP); Hirotada Seki, Toyokawa (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 463 days.

(21) Appl. No.: 12/724,163

(22) Filed: Mar. 15, 2010

(65) Prior Publication Data

US 2010/0232826 A1 Sep. 16, 2010

(30) Foreign Application Priority Data

Mar. 16, 2009 (JP) ................................ 2009-062599

(51) Int. Cl.
*G03G 21/20* (2006.01)
*H05K 7/20* (2006.01)

(52) U.S. Cl. ......................................... 399/92; 361/688

(58) Field of Classification Search .................... 399/92, 399/94; 361/688, 690, 695, 676, 679.46, 361/679.48

See application file for complete search history.

(56) References Cited

FOREIGN PATENT DOCUMENTS

| | | |
|---|---|---|
| JP | 8-121922 | 5/1996 |
| JP | 2006-126604 | 5/2006 |
| JP | 2007145481 A * | 6/2007 |

* cited by examiner

*Primary Examiner* — Walter L Lindsay, Jr.
*Assistant Examiner* — Billy J Lactaoen
(74) *Attorney, Agent, or Firm* — Morrison & Foerster LLP

(57) ABSTRACT

In an image formation state, to cool a recording sheet on a route from a fixer to a paper ejection roller, a blast fan assumes a first position restrained by a first fixture. Also, in another state, to cool a recording sheet on the catch tray, the blast fan assumes a second position restrained by a second fixture. To transition from the image formation state to another state, the blast fan sends a strong blast in a reverse direction from the normal blast direction. A bias is generated on the blast fan due to the resulting reactive force, the blast fan becomes free from the restraint of the first fixture, and shifts from the first position to the second position. Conversely, to transition from another state to the image formation state, a strong blast is sent in the same direction as the normal blast direction, and the blast fan shifts from the second position to the first position.

16 Claims, 11 Drawing Sheets

COOLING APPARATUS AND IMAGE FORMATION APPARATUS

CROSS-REFERENCE TO RELATED APPLICATIONS

This application is based on application No. 2009-062599 filed in Japan, the contents of which are hereby incorporated by reference.

BACKGROUND OF THE INVENTION

1. Field of the Invention

The present invention relates to a cooling apparatus and an image formation apparatus, and in particular to technology for reducing a number of cooling apparatuses necessary for cooling the image formation apparatus.

2. Related Art

In the body of an image formation apparatus, a fixing apparatus, a laser, scan unit (LSU), and a central processing unit (CPU) are sources of heat. To prevent heat malfunction caused by these heat sources, there is an apparatus in which a plurality of cooling apparatuses are screwed directly into the housing cover of the apparatus, or a chassis or the like in the housing cover (Japanese Patent Application Publication No. H08-121922).

However, providing a plurality of cooling apparatuses leads to higher cost and larger size of the apparatus due to the increased number of parts for the image forming apparatus. For this reason, there is a technology for reducing the number of fans by providing an airflow control apparatus such as a jalousie on the fan outlet side, and changing the direction of airflow with use of the jalousie (Japanese Patent Application Publication No. 2006-126604).

In the structure recited in Japanese Patent Application Publication No. 2006-126604, some type of drive source is necessary for driving the airflow control apparatus. For this reason, the effect achieved by reducing the number of fans is diminished (since providing the drive source requires space and cost).

SUMMARY OF THE INVENTION

The problem to be solved by the present invention is achieving both an expansion of cooling range and a high-efficiency use of space.

To solve the above problem, the cooling apparatus of the present invention selectively cools one or more objects among a plurality of objects, and includes a fan capable of oscillating around an axis and which is capable of supplying cooling air to an object in a state where the oscillation stops; and an obstructer operable to obstruct the oscillation of the fan in positions in which the fan is capable of cooling the object, wherein the fan is capable of changing the own force of a blast, and when the force of the blast of the fan is less, than a predetermined value, the obstructer obstructs the oscillation of the fan, and when the force of the blast of the fan becomes greater than the predetermined value, the obstructer stops obstructing the oscillation.

BRIEF DESCRIPTION OF THE DRAWINGS

These and other objects, advantages, and features of the invention will become apparent from the following description thereof taken in conjunction with the accompanying drawings, which illustrate specific embodiments of the present invention.

In the drawings.

DESCRIPTION OF PREFERRED EMBODIMENTS

The following describes, with reference to the drawings, embodiments of the cooling apparatus and the image formation apparatus of the present invention.

[1] Embodiment 1

First, the following describes embodiment 1 of the present invention.

(1) Structure of the Image Formation Apparatus

First, the following describes the structure of the image formation apparatus pertaining to the present embodiment.

Figure 1:
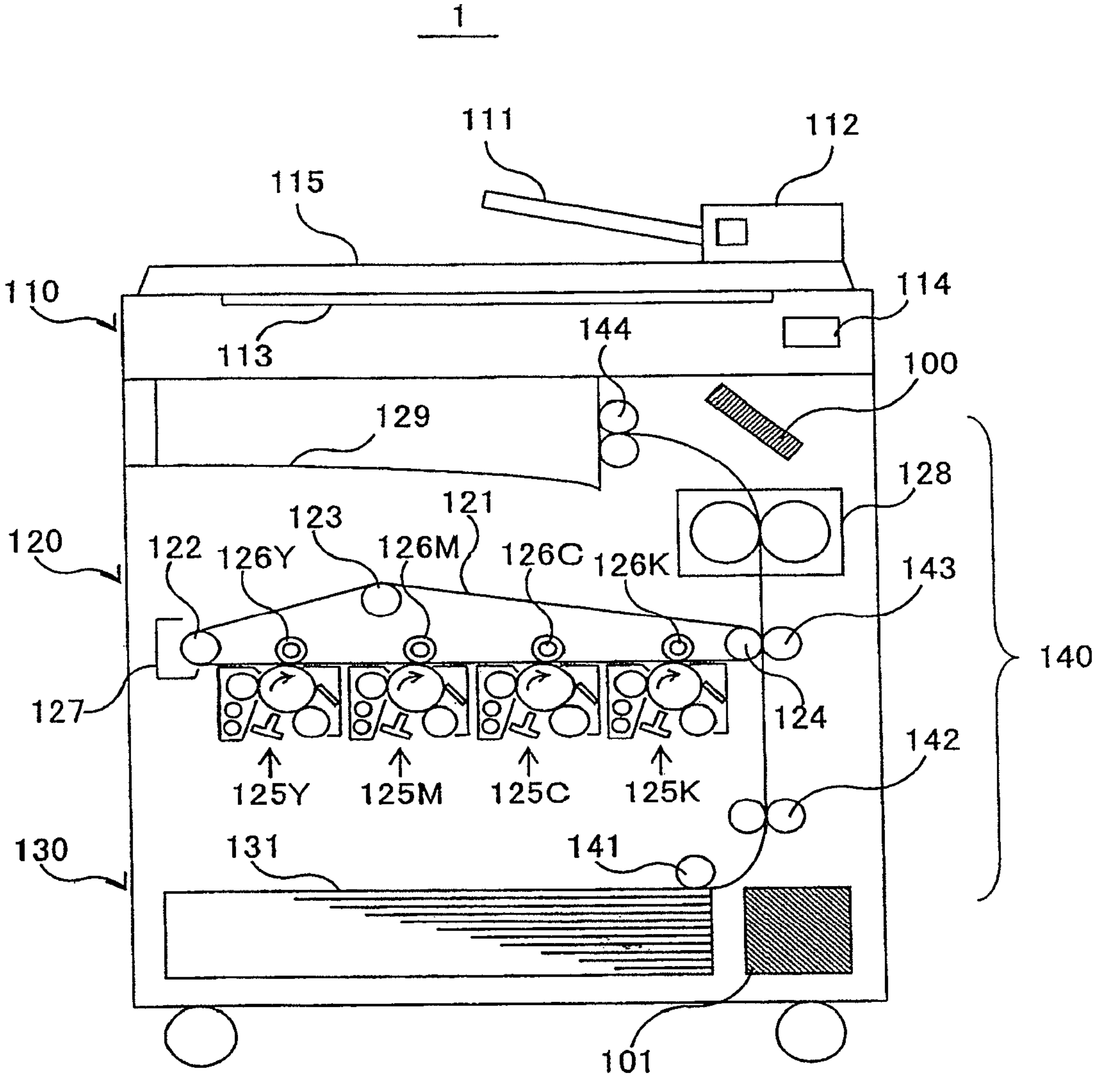
FIG. 1 shows a main structure of the image formation apparatus pertaining to embodiment 1 of the present invention.

FIG. 1 shows a main structure of the image formation apparatus pertaining to the present embodiment. As shown in FIG. 1, the image formation apparatus 1 is a tandem method color image formation apparatus, and includes a cooling apparatus 100, an image reader 110, an image formation section 120, a paper storage section 130, and a paper transporter 140.

The image reader 110 includes a loading platform 111, a transport section 112, an original glass plate 113, a scanner 114, and an ejection platform 115. Also, the image reader 110, according to directions from a user, obtains an original, one sheet at a time, via the transport section 112, and transports the original to the top of the original glass plate 113.

The original on top of the original glass plate 113 is read by the scanner 114, and ejected to the top of the ejection platform 115. The scanner 114 includes a three-row CCD (Charge Coupled Device) line sensor corresponding to the three primary colors. The scanner 114 reads the original and generates image data in each color.

Note that the scanner 114 may use a sheet-through method, in which the original is read by passing sheets through while the CCD line sensor is still. Also, image data may be generated by exposing the original loaded on the original glass plate 113 with use of an exposure lamp and reflective mirrors that are moving in parallel with the original glass plate 113, and guiding the reflected light to the CCD line sensor via the plurality of reflective mirrors.

The image formation section 120 includes an intermediate transfer belt 121, rollers 122 to 124, image creation sections 125Y to 125K, primary transfer rollers 126Y to 126K, a cleaning apparatus 127, a fixer 128, and a catch tray 129.

The intermediate transfer belt 121 is suspended over the rollers 122 to 124. The image creation sections 125Y to 125K are arranged in a row along the intermediate transfer belt 121 in the order of yellow (Y), magenta (M), cyan (C), and black (K). The image creation sections 125Y to 125K create a toner image in each of the colors YMCK based on the image data generated by the scanner 114.

The toner images created by the image creation sections 125Y to 125K are electrostatically transferred by the primary transfer rollers 126Y to 126K respectively at appropriate timings, so that the toner images are superimposed on the intermediate transfer belt 121. Accordingly, a color image is formed.

The paper storage section 130 includes a paper feed cassette 131. A recording sheet is stored in the paper feed cassette 131. Note that the paper storage section 130 may include a plurality of paper feed cassettes for recording sheets of different sizes, and may be configured to feed a recording sheet of a size specified by a user.

The paper transporter 140 includes rollers 141 to 144. The roller 141 is a so-called pick-up roller, and obtains the recording sheets stored in the paper feed cassette 131 one at a time. The obtained recording sheets are then conveyed by the roller 142.

The roller 143 is a so-called secondary transfer roller and electrostatically transfers the toner image on the intermediate transfer belt 121 to the recording sheet. Thereafter, the residual toner on the intermediate transfer belt 121 is collected and disposed of by the cleaning apparatus 127.

The fixer 128 includes a heating roller, a pressure roller and a heater lamp (depiction omitted), etc. The fixer 128 melts the toner image on the recording sheet, and fuses the toner image to the recording sheet. The roller 144 is a so-called ejection roller, and ejects the recording sheet having the toner image fixed thereon to the catch tray 129.

While the image is being fixed to the recording sheet, the cooling apparatus 100 performs cooling by blasting air (cooling air) on the recording sheet toward the roller 144 from the fixer 128. Also, at times other than fixing, the cooling apparatus 100 blasts air toward the roller 144, thus preventing heat malfunction by self-cooling, and improving temperature maintenance of the fixer 128. Note that the following describes the structure of the cooling apparatus 100.

The control apparatus 101 performs general control of the operation of the image formation apparatus 1, such as control of the strength of the air blasted by the cooling apparatus 100.

(2) Structure of the Cooling Apparatus 100

Next, the following describes the structure of the cooling apparatus 100.

Figure 2:
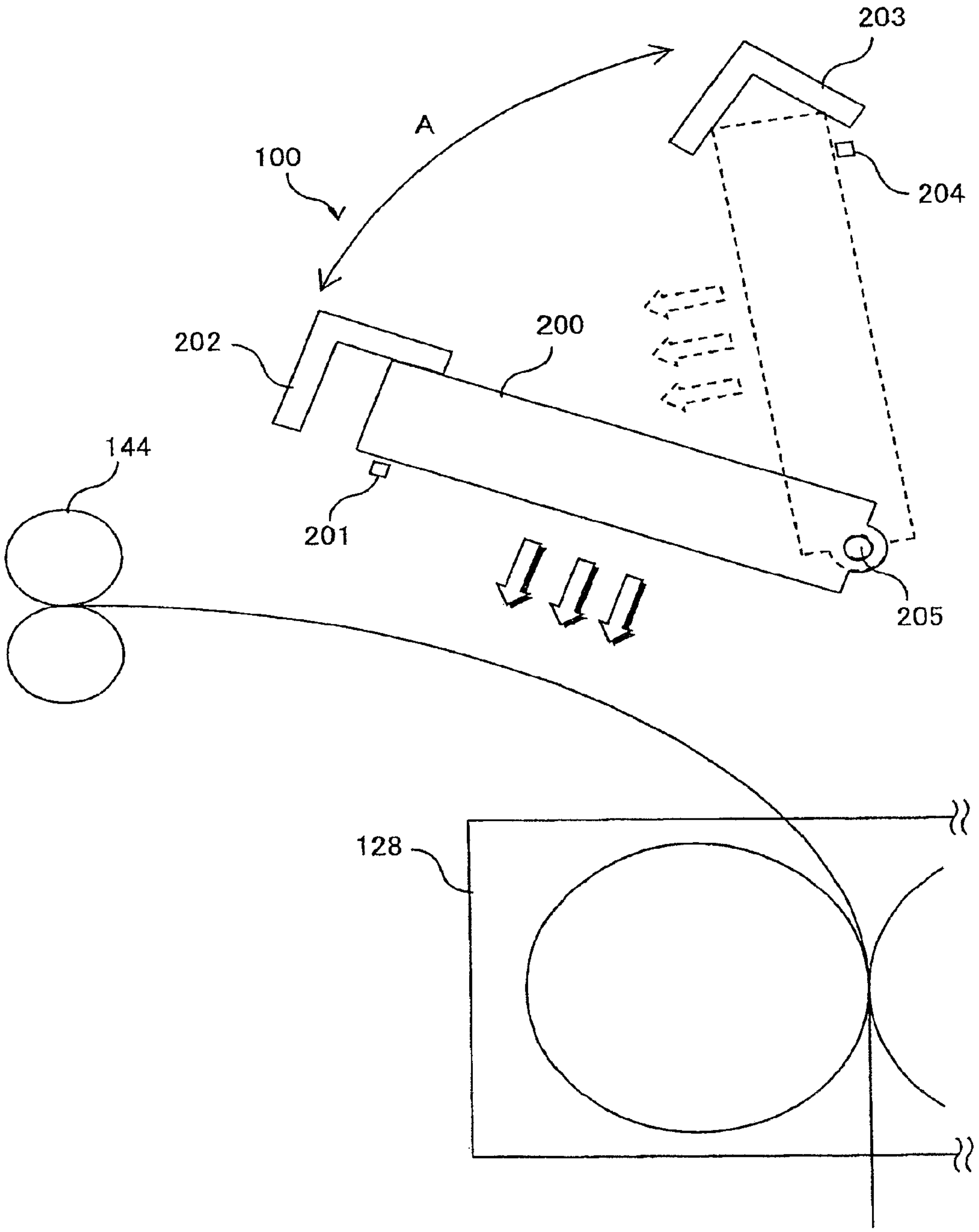
FIG. 2 shows a main structure of a cooling apparatus 100.

FIG. 2 shows a main structure of the cooling apparatus, 100. As shown in FIG. 2, the cooling apparatus 100 includes a blast fan 200, stoppers 201 and 204, fixtures 202 and 203, and an oscillation axis 205. The blast fan 200 is supported by the oscillation axis 205 so as to oscillate freely.

The blast fan 200 oscillates in an arrow A direction due to the force of its own blast. When in a position (hereinafter referred to as the "first position") shown by solid lines, the blast fan 200 sends a blast to the recording sheet transported on the route from the fixer 128 toward the roller 144, and cools the recording sheet.

Also, when in a position shown by broken lines (hereinafter referred to as the "second position"), the blast fan 200 cools itself by blasting air toward the roller 144. This enables preventing heat malfunction of the blast fan 200 due to heat generated by the fixer 128. Also, since air is not blasted to the fixer 128, this does not interfere with the temperature maintenance of the fixer 128.

Upon making contact with the blast fan 200, rectangular column-shaped stoppers 201 and 204 obstruct the oscillation of the blast fan 200. For this reason, the blast fan 200 cannot oscillate outside of the range defined by the stoppers 201 and 204.

The fixtures 202 and 203 are provided in the oscillation range of the blast fan 200. The fixtures 202 and 203 obstruct the oscillation of the blast fan 200, and as described later, change position when greater than or equal to a predetermined amount of force is applied by the blast operation of the blast fan 200.

Accordingly, when in the first position, the blast fan 200 is supported by the fixture 202. Note that the fixture 202 includes a torsion coil spring as described later. With use of the elastic resiliency of the torsion coil spring, the blast fan 200 is held sandwiched between the fixture 202 and the stopper 201.

Accordingly, the blast fan 200 is stably supported. When the air force of the blast fan 200 exceeds the elastic resiliency, the blast fan 200 is no longer held sandwiched between the fixture 202 and the stopper 201.

Also, when in the second position, since the blast fan 200 is supported by the fixture 203 so as not to oscillate, the blast direction of the air blown by the blast fan 200 is stable.

Note that the fixtures 202 and 203 are shown schematically in FIG. 2, and the details of the structure of the fixtures 202 and 203 and their positional relationship with the blast fan 200 are described below.

(3) Structure of the Fixtures 202 and 203

Next, the following describes the structure of the fixture 202. Since the fixture 203 also has the same structure, the description of the structure of the fixture 202 also applies to the structure of the fixture 203.

Figure 3A:
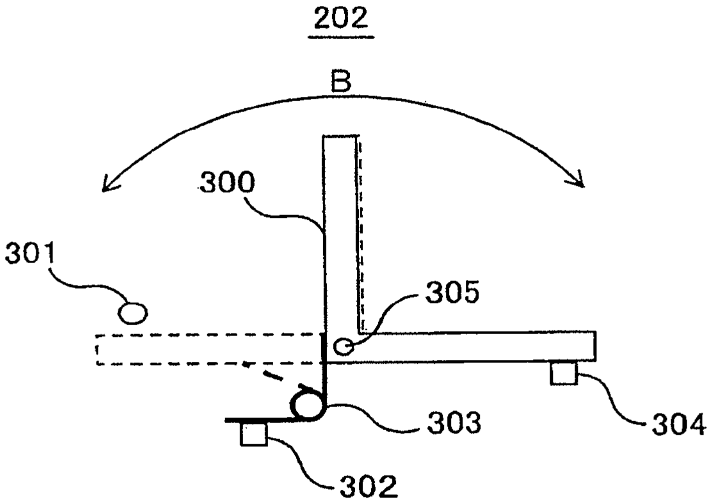
FIGS. 3A, 3B, and 3C show a math structure of a fixture 202, FIG. 3A showing the entirety of the fixture 202, FIG. 3B showing an elastic brace in the fixture 202, and FIG. 3C showing an external perspective view of the fixture 202.
Figure 3B:
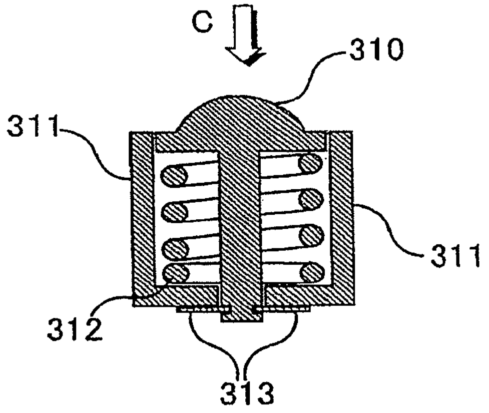
Figure 3C:
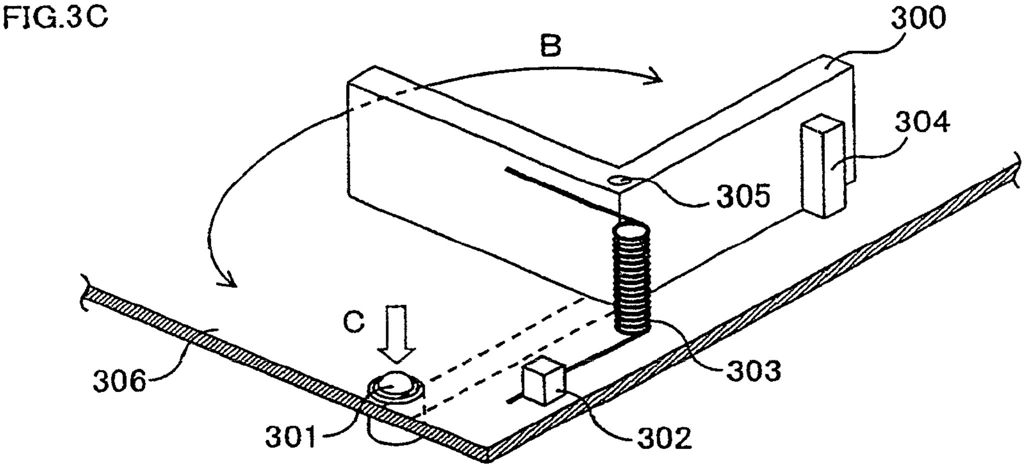

FIGS. 3A, 3B, and 3C show a main structure of the fixture 202. FIG. 3A shows the entirety of the fixture 202, FIG. 3B shows the elastic brace in the fixture 202, and FIG. 3C is an external perspective view of the fixture 202.

As shown in FIG. 3A, the fixture 202 includes an L-shaped metal fitting 300, an elastic brace 301, stoppers 302 and 304, a torsion coil spring 303, and an oscillation axis 305.

The L-shaped metal fitting 300 is supported by the oscillation axis 305 so as to oscillate freely. The L-shaped metal fitting 300 oscillates in an arrow B direction with the oscillation axis 305 as the center. The torsion coil spring 303 is in contact with the L-shaped metal fitting 300, and the oscillation of the L-shaped metal fitting 300 is obstructed by the torsion coil 303. The oscillation of the L-shaped metal fitting 300 is also obstructed by the stopper 304.

The torsion coil spring 303 is supported by an axis that is not depicted in the drawings. When one end of the torsion coil spring 303 is in contact with the L-shaped metal fitting 300, the other end thereof is in contact with the rod-shaped stopper 302. The torsion coil spring 303 holds the L-shaped metal fitting 300 in the position shown with solid lines (hereinafter referred to as the "first position"), through elastic force.

As shown by FIG. 3B, the elastic brace 301 includes a core portion 310, cylindrical portions 311, coil springs 312 and washers 313. The elastic brace 301 of FIG. 3A is shown as viewed from an arrow C direction of FIG. 3B.

One end of the core portion 310 is a hemispheric shape, and the L-shaped metal fitting 300 is capable of making contact with this end. When the coil spring 312 is sufficiently compressed by the L-shaped metal fitting 300, the core portion 310 is pushed down in the arrow C direction by the force of the L-shaped metal fitting 300. As a result, the L-shaped metal fitting 300 passes through the core portion 310.

Meanwhile, when the coil spring 312 is not sufficiently compressed due to weakness of the force of the L-shaped metal fitting 300 on the core portion 310, the L-shaped metal fitting 300 cannot pass through the core portion 310, and the oscillation of the L-shaped metal fitting 300 is obstructed.

Note that the cylindrical portions 311 guide the core portion 310 so that the core portion 310 is displaced along the arrow C direction. Also, the washer 313 prevents the core portion 310 from disengaging from the cylindrical portions 311.

As shown in FIG. 3C, the fixture 202 is supported by a support plate 306. Also, the elastic brace 301 projects out of the hemispherical portion of the core portion 310 from the surface of the support plate 306. The L-shaped metal fitting 300 oscillates in the arrow B direction, and when the L-shaped metal fitting 300 slides past the hemispherical portion of the core 310 and reaches the position shown by broken lines, the hemispherical portion of the core portion 310 again projects from the surface of the support plate 306, and the oscillation of the L-shaped metal fitting is obstructed.

Note that, for ease of understanding the present specification, FIGS. 3A and 3C show a case in which the metal fitting 300 rotates approximately 90 degrees. However, the range of movement of the L-shaped metal fitting 300 is to be determined in relation to the range of movement of the blast fan 200. In other words, needless to say, the range of movement of the L-shaped metal fitting 300 is not limited to 90 degrees, and may instead be less than or greater than 90 degrees.

(4) Operation of the Cooling Apparatus 100

Next, the following describes the operation of the cooling apparatus 100. Here, a case is described of using the fixer 128 and the recording sheet as cooling objects. In the cooling apparatus 100, control of the force at which air is blown and positional control are performed by controlling the power supply to the blast fan 200, which is performed by the control apparatus 101.

Figure 4:
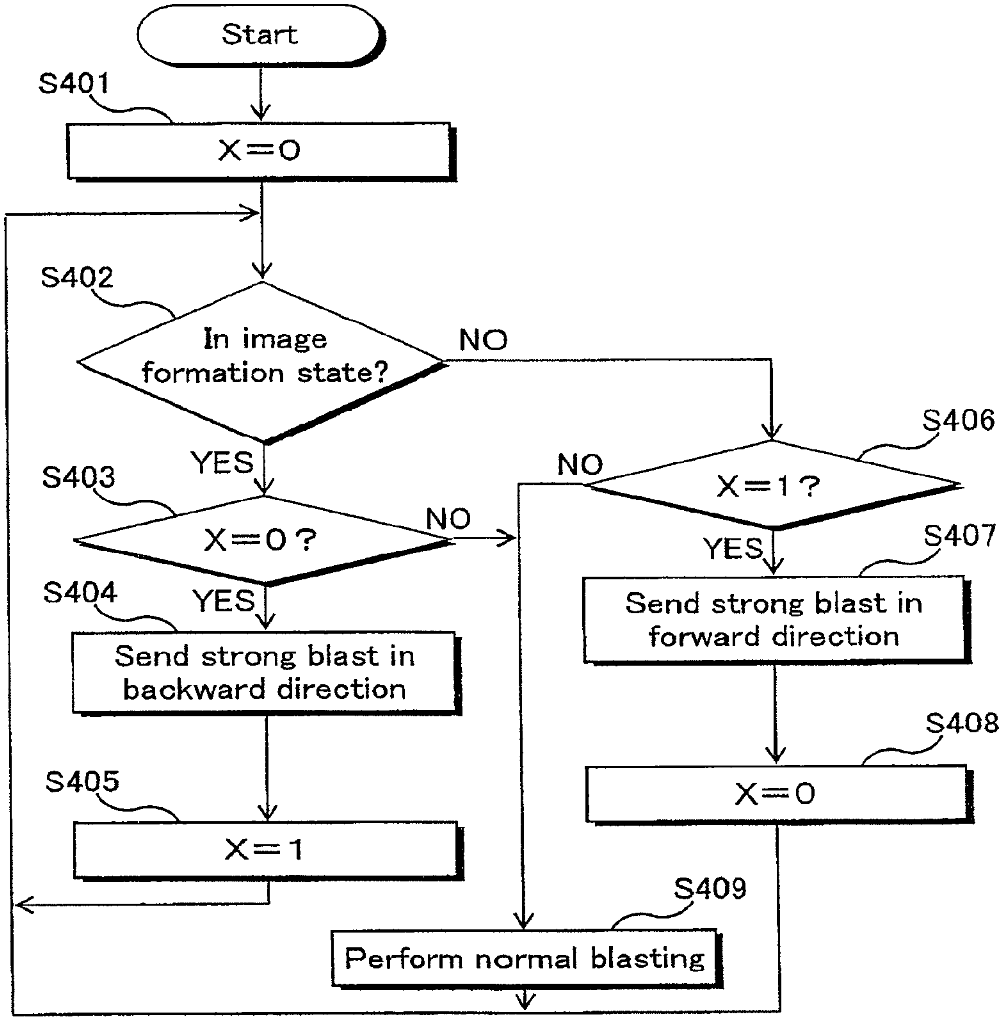
FIG. 4 is a flowchart showing control operations performed by a control apparatus 101.

FIG. 4 is a flowchart showing control operations performed by the control apparatus 101. As shown in FIG. 4, after power is applied, the control apparatus 101 first initializes the value of a parameter X to 0 (S401). The parameter X is used for detecting whether the image formation apparatus 1 has transitioned from the image formation state to another state, or has transitioned from another state to the image formation state. Note that when initializing is performed, the blast fan 200 is shifted to the second position.

Next, the control apparatus 101 judges whether the image formation apparatus 1 is in the image formation state. If the judgment is affirmative (S402: YES), furthermore, the value of the parameter X is checked. If the value of the parameter X is 0 (S403: YES), since a judgment is made that the image formation apparatus 1 has transitioned from a state other than the image formation state to the image formation state, the blast fan 200 sends a strong blast in the reverse direction from the normal blast direction, that is, the backward direction (S404).

Due to the reactive force of the strong blast, the blast fan 200 becomes free from restraint by the fixture 203, transitions to the first position, and is restrained by the fixture 202. Thereafter, the control apparatus 101 sets the value of the parameter X to 1 (S405), and proceeds to step S402.

When the image formation apparatus 1 is in the image formation state (S402: YES), if the value of the parameter X is not 0 (S403: NO), normal blasting is performed in the first position (S409). Accordingly, the recording sheet passing from the fixer 128 toward the roller 144 is cooled.

When the image formation apparatus 1 is not in the image formation state (S402: NO), the control apparatus 101 references the value of the parameter X. If the value of the parameter X is 1 (S406: YES), since a judgment is made that the image formation apparatus 1 has transitioned from the image formation state to another state, a strong blast is sent in the same direction as a normal blast, that is to say, the forward direction (S407).

Due to the reactive force of the strong blast, the blast fan 200 becomes free from restraint by the fixture 202, transitions to the second position, and is restrained by the fixture 203. Thereafter, the control apparatus 101 sets the value of the parameter X to 0 (S408), and proceeds to step S402.

When the image formation apparatus 1 is in a state other than the image formation state (S402: NO), and the value of the parameter X is not 1 (S406: NO), normal blasting in the second position is performed (S409). Accordingly, the blast fan 200 is cooled, and heat malfunction is prevented.

Figure 5A:
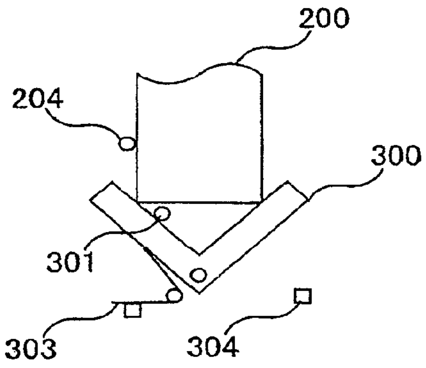
FIGS. 5A, 5B, 5C, and 5D show how a blast fan 200 becomes free from a second position, FIG. 2A showing a state when the blast fan 200 is in the second position, and by the process shown in FIGS. 5B to 5D, the blast fan 200 becomes free from the second position.
Figure 5C:
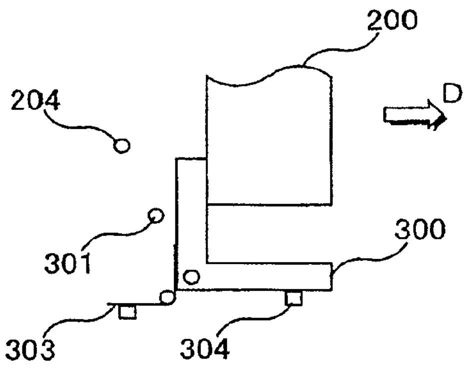
Figure 5B:
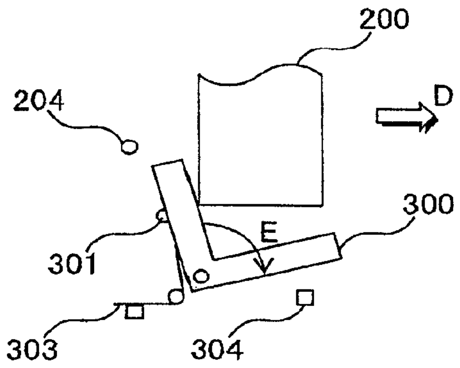
Figure 5D:
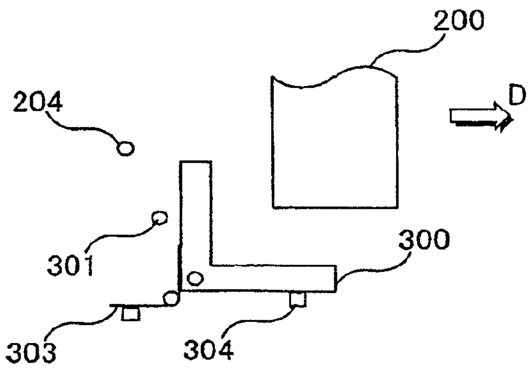

FIGS. 5A, 5B, 5C, and 5D show how a blast fan 200 becomes free from a second position, FIG. 5A showing a state when the blast fan 200 is in the second position, and by the process shown in FIGS. 5B to 5D, the blast fan 200 becomes free from the second position.

First, as shown in FIG. 5A, when the blast fan 200 is in the second position, the blast fan 200 is supported, so as not to be capable of oscillation, by being sandwiched between the stopper 204 and the L-shaped metal fitting 300. Also, the L-shaped metal fitting 300, by being sandwiched between the elastic brace 301 and the torsion coil spring 303, is supported so as not to be capable of oscillation.

Upon receiving the reactive force of the strong blast sent in the backward direction from the second position by the blast fan 200, the blast fan 200 oscillates in an arrow D direction toward the first position. As a result, due to the blast fan 200 causing the L-shaped metal fitting 300 to oscillate in an arrow E direction, the elastic brace 301 is pushed down, and the obstruction of the L-shaped metal fitting 300 by the elastic brace 301 is released (FIG. 5B).

Then, since the L-shaped metal fitting 300 is biased due to the elastic resiliency of the torsion coil spring 303, the L-shaped metal fitting 300 furthermore oscillates in the arrow E direction. As a result, when the L-shaped metal fitting 300 is in contact with the stopper 304, the L-shaped metal fitting 300 can oscillate no further, and is still (FIG. 5C).

Even after the L-shaped metal fitting 300 is still, the blast fan 200 continues to shift in the arrow D direction toward the first position (FIG. 5D).

Figure 6A:
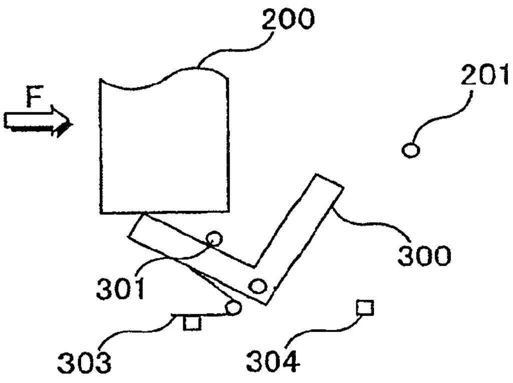
FIGS. 6A, 6B, 6C, and 6D show steps taken until the blast fan 200 is supported in the first position so that the fan is not capable of oscillation, FIG. 6A showing the blast fan 200 nearing the first position, and by the process shown in FIGS. 6B to 6D, the blast fan 200 becomes supported in the second position so that the fan is not capable of oscillation.

FIGS. 6A, 6B, 6C, and 6D show the blast fan 200 being supported in the first position so as not to be capable of oscillation, and FIG. 6A shows the blast fan 200 nearing the first position. By the process shown in FIGS. 6B to 6D, the blast fan 200 becomes supported in the first position so as not to be capable of oscillation.

Figure 6B:
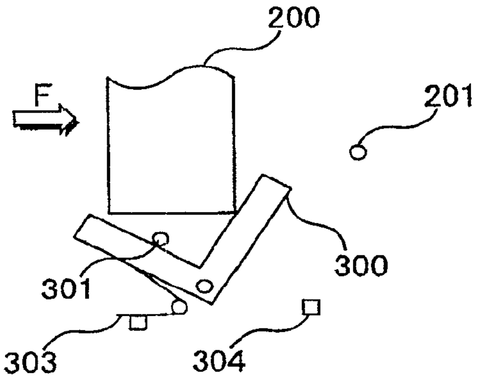
Figure 6C:
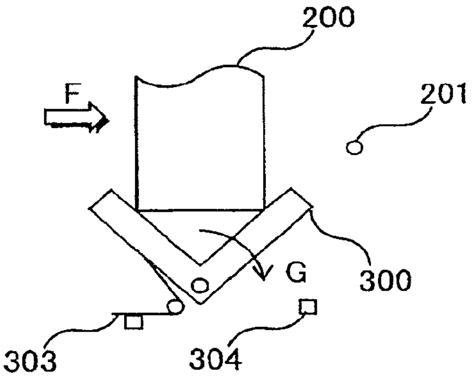

First, as shown in FIG. 6A, carried by self-generated bias force, the blast fan 200 nears the first position while moving in an arrow F direction, and makes contact with the L-shaped metal fitting 300 (FIG. 6B). Accordingly, when the obstruction of the L-shaped metal fitting 300 by the elastic brace 301 is released, due to the reactive force of the strong blast by the blast fan 200 and the elastic resiliency of the torsion coil spring 303, the L-shaped metal fitting 300 oscillates in an arrow G direction (FIG. 6C).

Figure 6D:
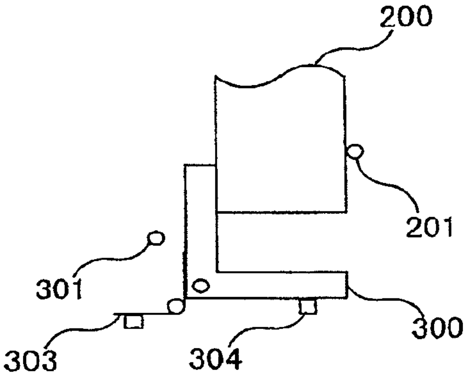

Thereafter, the blast fan 200 makes contact with the stopper 201, and stops. The L-shaped metal fitting 300 makes contact with the stopper 304, and stops. In this case, since the torsion coil spring 303 pushes the L-shaped metal fitting 300 against the blast fan 200 using elastic resiliency, the blast fan 200 is supported so as not to be capable of oscillation (FIG. 6D).

To shift from the first position to the second position, the above operations are performed in reverse. Operating in this way enables changing the orientation of the blast fan 200 and sending blasts to a plurality of cooling objects, that is to say, to the recording sheet on the conveyance path from the fixer 128 to the roller 144, and the recording sheet on the catch tray 129, without using a drive source other than the drive source that rotates the blast fan 200.

[2] Embodiment 2

The following describes embodiment 2 of the present invention (here, in the second embodiment, a circuit substrate is the cooling object).

Figure 7:
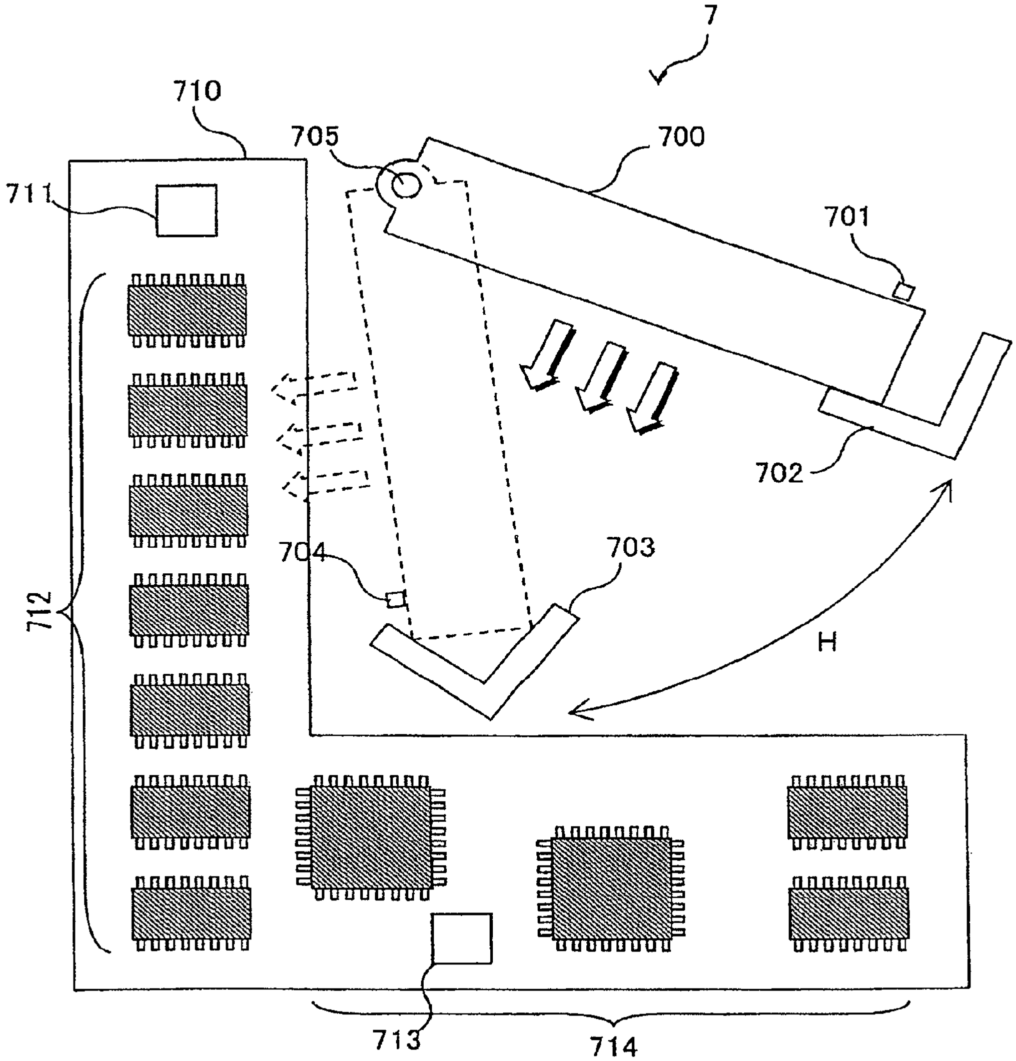
FIG. 7 is a planar view schematically showing main structures of a cooling apparatus and a circuit substrate that is a cooling object, according to embodiment 2 of the present invention.

FIG. 7 is a planar view schematically showing main structures of a cooling apparatus and a circuit substrate that is a cooling object, according to the present embodiment. As shown in FIG. 7, the cooling apparatus 7 includes a blast fan 700, stoppers 701 and 704, fixtures 702 and 703, and an oscillation axis 705. The blast fan 700 is movably supported by the oscillation axis 705.

The cooling objects of the cooling apparatus 7 are circuit elements 712 and 714 mounted on the circuit substrate 710. Also, the circuit substrate 710 includes temperature sensors 711 and 713.

The blasting of the blast fan 700 causes the blast fan 700 to oscillate in an arrow H direction. When the blast fan 700 is in the position shown by solid lines (hereinafter called the "first position"), the blast fan 700 blasts air to the circuit element group 714, thus cooling the circuit element group 714. Also, when the blast fan 700 is in the position shown by broken lines (hereinafter referred to as the "second position"), the blast fan 700 blasts air to the circuit element group 712, thus cooling these circuit elements.

By making contact with the blast fan 700, the rod-shaped stoppers 701 and 704 obstruct the oscillation of the blast fan 700. For this reason, the blast fan 700 cannot oscillate past the range defined by the stoppers 701 and 704.

Meanwhile, the fixtures 702 and 703 are provided in the oscillation range of the blast fan 700. The fixtures 702 and 703 obstruct the oscillation of the blast fan 700, and also, as described later, change position when greater than or equal to a predetermined amount of force is applied by the blast operation of the blast fan 700.

Accordingly, when the blast fan 700 is in the first position, the blast fan 700 is supported by the fixture 702. Also, when the blast fan 700 is in the second position, since the blast fan 700 is supported so as not to oscillate by the fixture 703, the blast direction of the blown air of the blast fan 700 is stable.

Note that fixtures 702 and 703 in FIG. 7 are shown schematically, and the detailed structures of the fixtures 702 and 703, and the position relationship with the blast fan 700 are the same as in embodiment 1.

Also, although in embodiment 1, the position of the blast fan 200 is changed depending on whether the image formation apparatus 1 is in the image formation state, in the present embodiment, for example, the following structure may be used. The circuit substrate 710 itself includes the function of controlling the blast fan 700, and when the temperature difference rises above a predetermined value (for example, 3° C.) by comparing the temperature measuring results of the temperature sensors 711 and 713, the circuit substrate 710 tilts the blast fan 700 toward the circuit element group that has the higher temperature. Of course, there may instead be provided a control apparatus for the blast fan 700 that is separate from the circuit substrate 710.

This structure enables cooling the circuit element for which the temperature rise is the most significant, from among the two circuit element groups 712 and 714.

Note that the purpose of waiting to change the position of the blast fan 700 until the temperature difference is greater than a predetermined value is to reduce the frequency of changing the position of the blast fan 700, and to cool the circuit element groups 712 and 714 more effectively.

Needless to say, if the predetermined value is too small, there are cases in which the position of the blast fan 700 is changed due to temperature changes resulting from measuring errors, etc., and the frequency of changing the position increases unnecessarily. It is preferable to set an appropriate predetermined value in view of this.

(5) Supplementary Remarks

As described above, when the air force of the fan exceeds a predetermined value, support by the supporting member is released. Therefore, the drive source driving the fan can also be used for changing the blast direction of the fan. This enables cooling objects in a plurality of directions, as well as achieving superior space efficiency. Also, since the oscillation of the fan can be confined to a necessary range, the space efficiency of the cooling apparatus can be further improved. Furthermore, the space efficiency of the cooling apparatus can be improved.

[3] Modifications

This completes the description of the embodiments of the present invention. Needless to say, the present invention is not limited to the above embodiments, and the following modifications can also be implemented.

(1) In the above embodiments, a case is described of cooling the recording sheet and circuit elements, etc. However, needless to say, the present invention is not limited to this. The present invention is applicable to cooling objects spanning a plurality of directions, and the effect of the present invention can be achieved even in cases of selecting another cooling object instead of the recording sheet or the circuit element.

(2) In the above embodiments, a case is described in which an L-shaped metal fitting, etc. is used as a fixture for supporting the blast fan so as not to be capable of oscillation. However, needless to say, the present invention is not limited to this, and a fixture other than the L-shaped metal fitting may be used. For example, instead of the L-shaped metal fitting, the above-described elastic brace may be used.

Figure 8A:
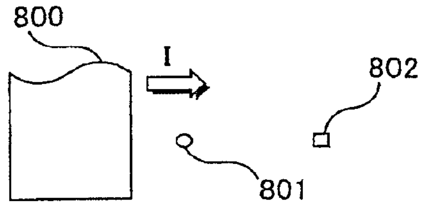
FIGS. 8A, 8B, 8C, 8D, 8E, and 8F illustrate operation of a fixture pertaining to a modification of the present invention, FIGS. 8A to 8C showing operation of a moving blast fan that is supported so as not to be capable of oscillation, and FIGS. 8D to 8F showing an operation by which the blast fan is supported so as not to be capable of oscillation and then becomes free.
Figure 8D:
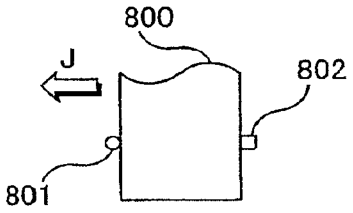
Figure 8B:
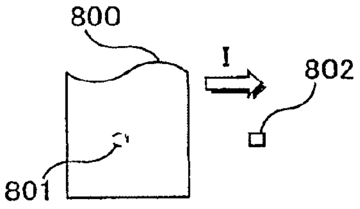
Figure 8E:
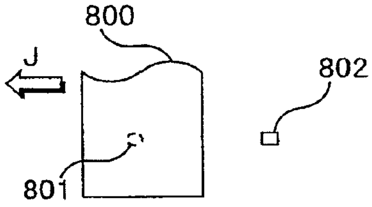
Figure 8C:
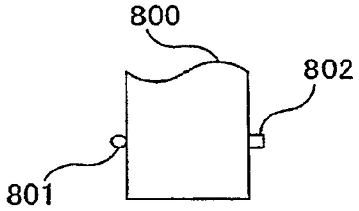
Figure 8F:
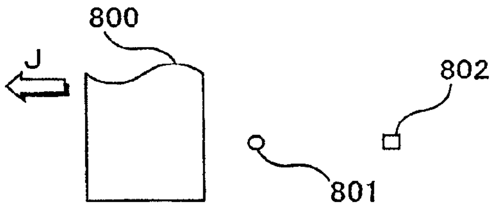

FIGS. 8A, 8B, 8C, 8D, 8E, and 8F illustrate operation of a fixture pertaining to modifications of the present embodiments, FIGS. 8A to 8C showing operation of a moving blast fan that is supported so as not to be capable of oscillation, and FIGS. 8D to 8F showing an operation by which the blast fan is supported so as not to be capable of oscillation and then becomes free.

That is to say, when the blast fan 800 advances in an arrow I direction due to self-generated bias force (FIG. 8A), the blast fan 800 pushes down the elastic brace 801, and furthermore advances in the arrow I direction (FIG. 8B). Thereafter, the blast fan 800, passing through the elastic brace 801, makes contact with the stopper 802. Then, since the elastic resiliency of the elastic brace 801 causes the elastic brace 801 to project outward, the blast fan 800 is held sandwiched between the elastic brace 801 and the stopper 802, and is supported so as not to be capable of oscillation (FIG. 8C).

Contrarily, when the blast fan 800 becomes free from restraint by the elastic brace 801 and the stopper 802, first, the blast fan 800, by causing the fan to rotate in the opposite direction from FIGS. 8A to 8C, causes generation of force for advancing in an arrow J direction (FIG. 8D).

Then, when force sufficient for pushing down the elastic brace 801 has been generated, the blast fan 800 becomes free from restraint by the elastic brace 801 and the stopper 802, and starts advancing in the arrow J direction (FIG. 8E). When the blast fan 800 further shifts in the arrow J direction, the elastic brace 801 is released from obstruction by the blast fan 800, and again projects out (FIG. 8F).

In this way, the effect of the present invention can be achieved regardless of the structure of the fixture.

(3) The above embodiments describe a case in which the blast fan is supported, so as not to be capable of oscillation, in two positions, namely the first position and the second position. However, needless to say, the present invention is not limited to this, and if there are three or more cooling objects, the blast fan may be supported, so as not to be capable of oscillation, in three or more positions, so that air can be blasted to all of these cooling objects.

(4) The above embodiments describe a case in which the blast direction is changed by causing the blast fan to oscillate. However, needless to say, the present invention is not limited to this, and the following structure may be used instead.

Figure 9:
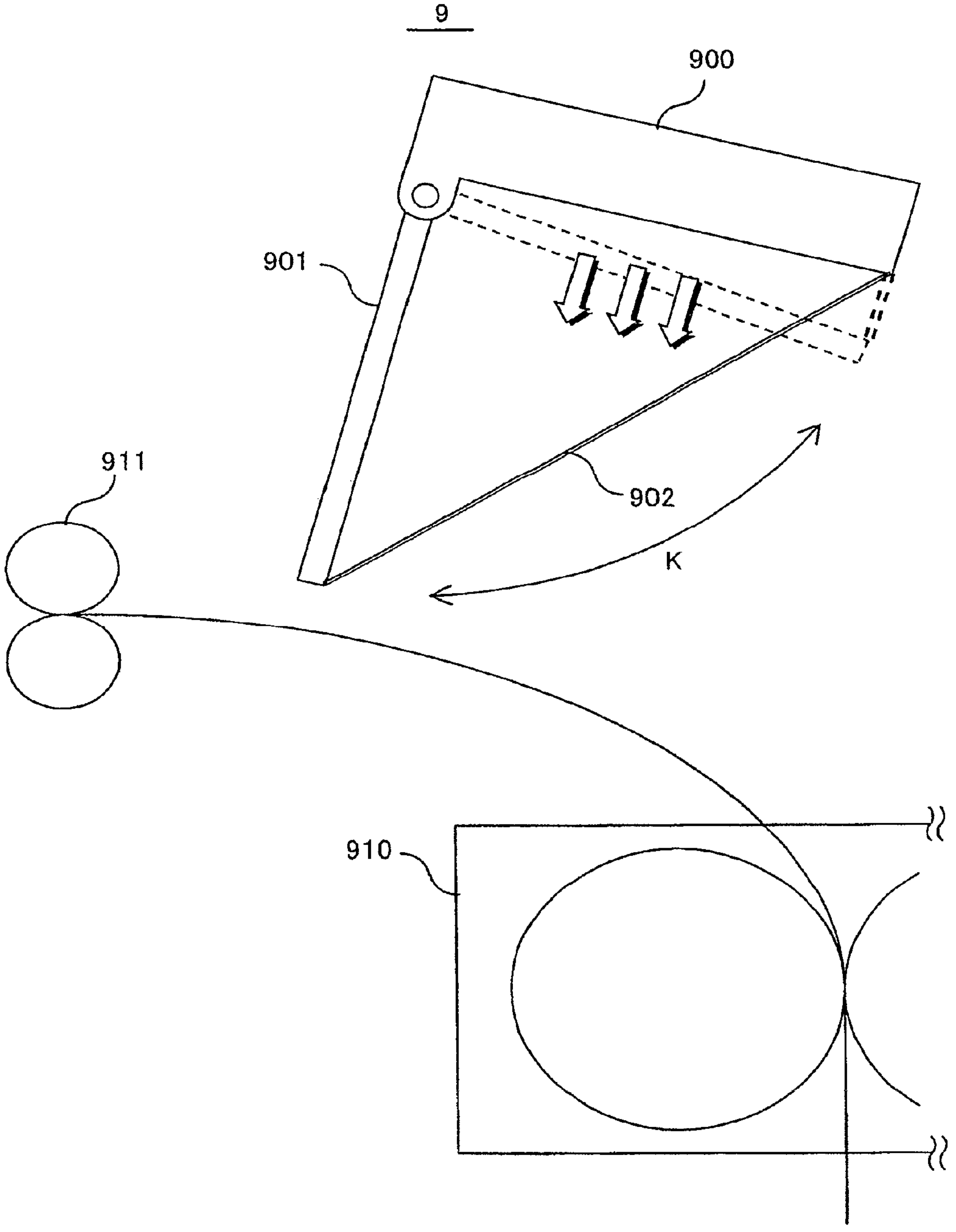
FIG. 9 shows a main structure of a cooling apparatus pertaining to a modification of the present invention.

FIG. 9 shows a main structure of a cooling apparatus pertaining to the present modification. As shown in FIG. 9, a cooling apparatus 9 includes a blast fan 900, a valve 901 and a spring 902. The cooling apparatus 9 cools a recording sheet conveyed along a route from a fixer 910 to a roller 911.

The valve 901 is attached to the blast fan 900 so that the valve 901 is capable of oscillation. The valve 901 is closed by the elastic resiliency of the spring 902. Also, the blast fan 900 resists the elastic resiliency of the spring 902 and opens the valve 901 by sending a strong blast to the valve 901. Accordingly, the recording sheet conveyed along the route from the fixer 910 to the roller 911 is cooled.

Also, when the valve 901 is in a closed state, the blast fan 900 is cooled by the air reflected back from the valve 901.

(5) The above embodiments describe a case of using an elastic brace including only one coil spring. However, needless to say, the present invention is not limited to this, and the following structure may be used instead.

Figure 10:
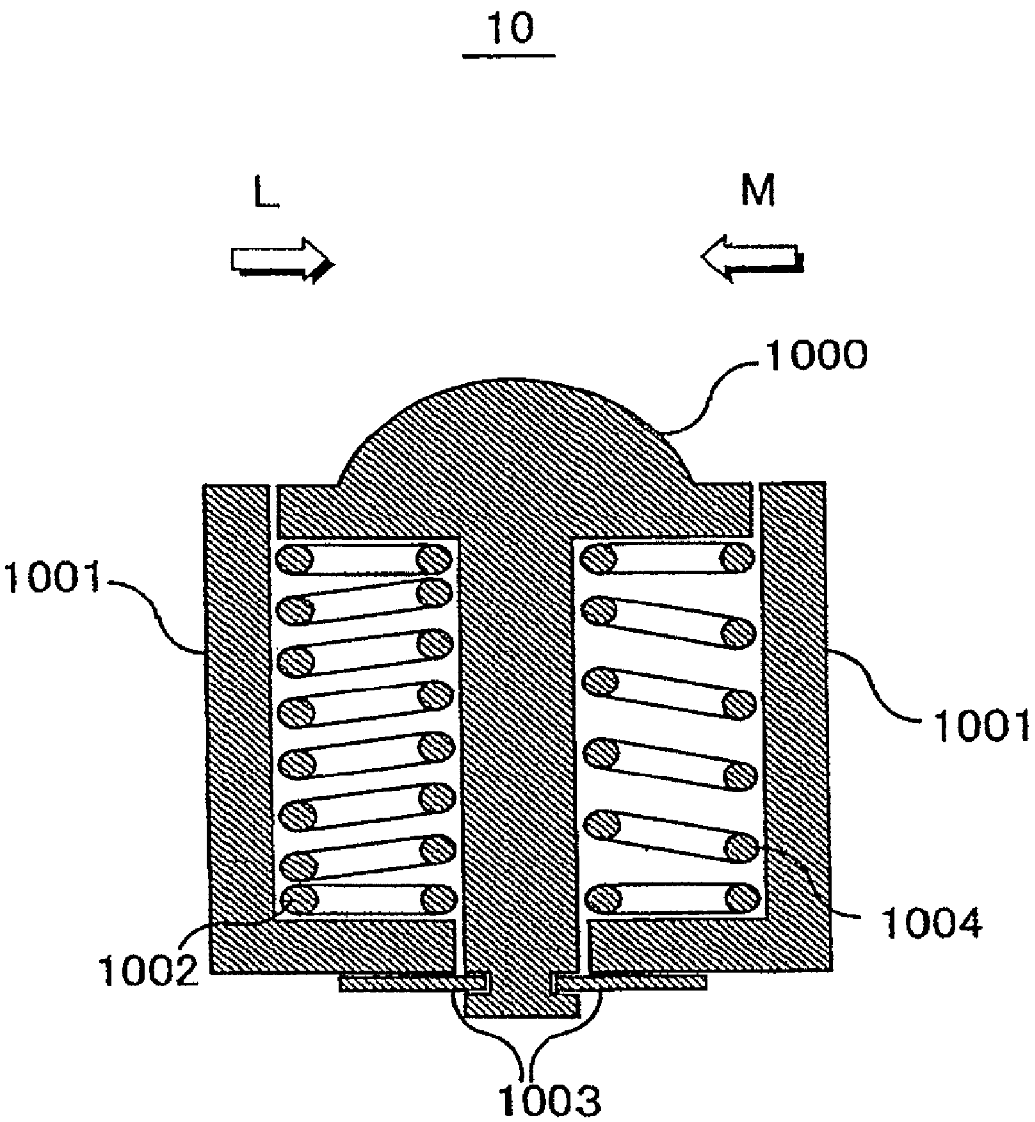
FIG. 10 is a cross-section showing a main structure of an elastic brace pertaining to the modification of the present invention.

FIG. 10 is a cross-section showing a main structure of an elastic brace pertaining to the present modification. As shown in FIG. 10, an elastic brace 10 has mainly the same structure as the elastic brace 301 in embodiment 1, but is different in having two coil springs. That is to say, an elastic modulus of the coil spring 1002 is larger than that of the coil spring 1004.

For this reason, since the coil spring 1002 compresses less readily than the coil spring 1004, the blast fan can more easily pass through the arrow M direction than the arrow L direction. Accordingly, holding the blast fan on the coil spring 1002 side of the elastic brace 10 enables continuously sending a stronger blast of air with the blast fan. Also, since it is difficult to block the blast fan from shifting in the arrow M direction, the blast fan can easily be shifted to the appropriate position.

Figure 11:
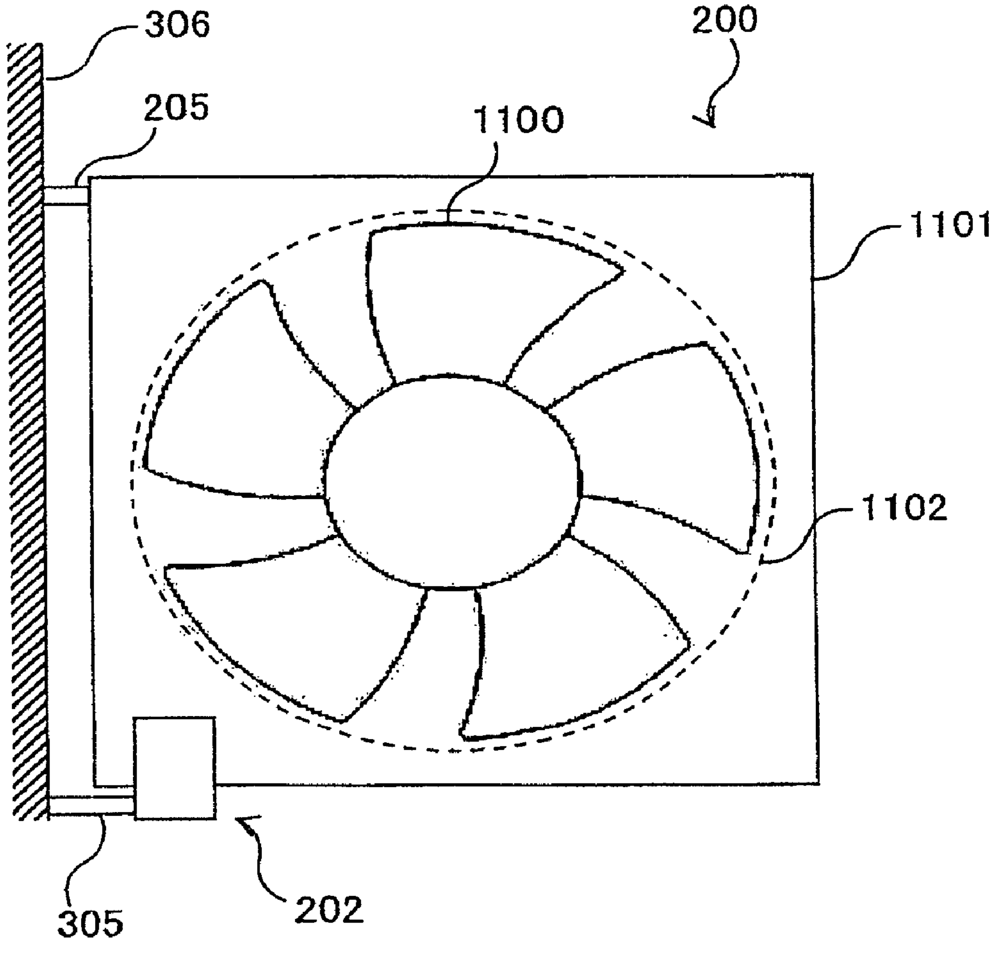
FIG. 11 is a front view showing the shapes of a blast fan 200 and a fixture 202 pertaining to the modification of the present invention.

(6) Although not specifically mentioned in the embodiments, since it is not preferable for the fixture 202 to block the blast from the blast fan 200, the following shape may be used. FIG. 11 shows a front view of the shapes of the blast fan 200 and the fixture 202. As shown in FIG. 11, in the blast fan 200, a fan portion 1100 is rotatably held in a frame 1101.

The blast fan is supported by the oscillation axis 205 so as to oscillate freely with respect to the support plate 306. The fixture 202 is also supported by the oscillation axis 205 so as to oscillate freely with respect to the support plate 306. The fan portion 1100 rotates in the area enclosed by broken lines 1102. For this reason, providing the fixture 202 outside the broken lines 1102 enables causing the blast from the fan portion 1100 not to be blocked by the fixture 202.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A cooling apparatus that selectively cools one or more objects among a plurality of objects, comprising:

a fan capable of oscillating around an axis and, which is capable of supplying cooling air to an object in a state where the oscillation stops; and an obstructer operable to obstruct the oscillation of the fan in positions in which the fan is capable of cooling the object, wherein the fan is capable of changing the own force of a blast, and when the force of the blast of the fan is less than a predetermined value, the obstructer obstructs the oscillation of the fan, and when the force of the blast of the fan becomes greater than the predetermined value, the obstructer stops obstructing the oscillation.

2. The cooling apparatus of claim 1, wherein the fan is capable of oscillating between a first position, in which the fan is capable of supplying cooling air to a first object, and a second position, in which the fan is capable of supplying air to a second object, and the obstructer stops obstructing the oscillation when the fan is to oscillate from the second position to the first position.

3. The cooling apparatus of claim 1, wherein the obstructer includes a first support member that supports the fan in a position in which the fan is capable of supplying cooling air to the object, and a second support member that supports the fan in a position in which the fan is not capable of supplying cooling air to the object.

4. The cooling apparatus of claim 1, wherein the fan oscillates by a reactive force of the cooling air.

5. The cooling apparatus of claim 1, further comprising:

a range limiter that defines an oscillation range of the fan.

6. A cooling apparatus that selectively cools one or more objects among a plurality of objects, comprising:

a fan supported so as to be capable of oscillating by force of a blast generated by rotation between a first position in which the fan is capable of supplying cooling air to a first object, and a second position in which the fan is capable of supplying air to a second object, the fan being capable of supplying cooling air to the first object and the second object;

an obstructer positioned so as to be capable of supporting the fan in the first position so as to obstruct the oscillation of the fan when the force of the blast of the fan is less than a predetermined value, and to stop the obstruction when the force of the blast of the fan becomes greater than the predetermined value; and a control apparatus operable to control a rotation state of the fan so that, when the fan is to be shifted from the first position to the second position, the obstruction by the obstructer is stopped.

7. An image formation apparatus comprising:

an image formation part capable of forming an image based on image information;

a fixer capable of fixing the image formed by the image formation part on a sheet; and a cooling apparatus operable to cool the sheet on which the image has been fixed by the fixer, the cooling apparatus including:

a fan that is supported so as to freely oscillate around an axis and is capable of supplying air to the sheet, and an obstructer, positioned so as to be capable of supporting the fan in one of a plurality of positions in which the fan is capable of cooling the sheet, so as to obstruct the oscillation of the fan when the force of the blast, of the fan is less than a predetermined value, and to stop the obstruction when the force of the blast of the fan becomes greater than the predetermined value.

8. An image formation apparatus comprising:

an image formation part capable of forming an image based on image information;

a fixer capable of fixing the image, formed by the image formation part on a sheet; and a cooling apparatus operable to cool a plurality of objects, the cooling apparatus including a fan supported so as to be capable of oscillating by force of a blast generated by rotation between a first position in which the fan is capable of supplying air to a first object, and a second position in which the fan is capable of supplying air to a second object, the fan being capable of supplying cooling air to the first object and the second object;

an obstructer positioned so as to be capable of supporting the fan in the first position so as to obstruct the oscillation of the fan when the force of the blast of the fan is less than a predetermined value, and to stop the obstruction when the force of the blast of the fan becomes greater than the predetermined value; and a control apparatus operable to control a rotation state of the fan so that, when the fan is to be shifted from the first position to the second position, the obstruction by the obstructer is stopped.

9. The cooling apparatus of claim 3, wherein when the fan is positioned so as not to be capable of supplying air to the object, the fan self-cools.

10. The cooling apparatus of claim 2, further including a range limiter that supports the fan in the second position, wherein the obstructer includes a first support member that supports the fan in a position in which the fan is capable of supplying cooling air to the object.

11. The cooling apparatus of claim 2, wherein the fan oscillates by a reactive force of the air.

12. The cooling apparatus of claim 3, wherein the fan oscillates by a reactive force of the air.

13. The cooling apparatus of claim 10, wherein the fan oscillates by a reactive force of the air.

14. The cooling apparatus of claim 2, further comprising:

a range limiter operable to define an oscillation range of the fan.

15. The cooling apparatus of claim 3, further comprising:

a range limiter operable to define an oscillation range of the fan.

16. The cooling apparatus of claim 10, further comprising:

a range limiter operable to define an oscillation range of the fan.

* * * * *